(12) United States Patent
Tourancheau

(10) Patent No.: US 7,444,424 B1
(45) Date of Patent: Oct. 28, 2008

(54) METHOD AND APPARATUS FOR ROUTING DATA ACROSS AN N-DIMENSIONAL GRID NETWORK

(75) Inventor: Bernard Tourancheau, Miribel (FR)

(73) Assignee: Sun Microsystems, Inc, Santa Clara, CA (US)

( * ) Notice: Subject to any disclaimer, the term of this patent is extended or adjusted under 35 U.S.C. 154(b) by 983 days.

(21) Appl. No.: 10/674,939

(22) Filed: Sep. 29, 2003

(51) Int. Cl.
*G06F 15/173* (2006.01)
*G06F 17/50* (2006.01)

(52) U.S. Cl. .................. 709/238; 709/249; 716/12; 710/38; 370/359

(58) Field of Classification Search ............... 709/238, 709/241, 243, 245, 249; 716/12–16; 710/38; 370/351, 357, 359
See application file for complete search history.

(56) References Cited

U.S. PATENT DOCUMENTS

| | | | |
|---|---|---|---|
| 5,138,615 A * | 8/1992 | Lamport et al. ............ | 370/400 |
| 5,546,596 A * | 8/1996 | Geist ........................ | 709/243 |
| 6,973,517 B1 * | 12/2005 | Golden et al. ............. | 710/104 |
| 7,072,976 B2 * | 7/2006 | Lee ........................... | 709/238 |

OTHER PUBLICATIONS

Wu, Jie. "A fault-tolerant adaptive and minimal routing scheme in n-D Meshes" The Computer Journal; 2002; 45, 3; pp. 349-363.*
Wu, Jie "A deterministic fault-tolerant and deadlock-free routing protocol in 2-D meshes based on Odd-Even Turn Model" ACM; ICS'02; Jun. 2002; pp. 67-76.*

* cited by examiner

*Primary Examiner*—David Lazaro
(74) *Attorney, Agent, or Firm*—Park, Vaughan & Fleming, LLP; Edward J. Grundler

(57) ABSTRACT

One embodiment of the present invention provides a system for routing data between integrated circuit devices. This system couples together an n-dimensional grid of integrated circuit devices using multiple independent communication networks, wherein each of the communication networks only moves data in two orthogonal directions (e.g., North and East, North and West, South and East, or South and West). The system also includes a routing mechanism that routes data across these communication networks, as well as, into, out of, and through integrated circuits within the n-dimensional grid of integrated circuits. Note that the process of routing a signal across a given network is greatly simplified because it is not possible to create a cycle that causes a deadlock within a given network.

18 Claims, 6 Drawing Sheets

METHOD AND APPARATUS FOR ROUTING DATA ACROSS AN N-DIMENSIONAL GRID NETWORK

GOVERNMENT LICENSE RIGHTS

This invention was made with United States Government support under Contract No. NBCH020055 awarded by the Defense Advanced Research Projects Agency. The United States Government has certain rights in the invention.

BACKGROUND

1. Field of the Invention

The present invention relates to mechanisms for transferring data within a computing system. More specifically, the present invention relates to a method and an apparatus for routing data across an n-dimensional grid network.

2. Related Art

Dramatic increases in microprocessor clock speeds have not been matched by corresponding increases in chip-to-chip communication speeds. Consequently, inter-chip communication delays are rapidly becoming a major bottleneck to overall computer system performance. For example, it is now common for accesses to off-chip memory to require hundreds of processor clock cycles. This means that microprocessors are often stalled waiting for memory operations to complete.

The performance-limiting effects of these long inter-chip communications delays can be somewhat mitigated by providing large on-chip caches, and by providing mechanisms to support out-of-order execution, so that useful work can be accomplished during accesses to off-chip memory. However, as memory accesses begin to take hundreds of processor cycles to complete, even these large on-chip caches and out-of-order execution cannot keep a processor busy on typical processor workloads.

System developers are beginning to consider different interconnection topologies to provide fast chip-to-chip communication within computer systems. One promising topology is a two-dimensional grid network, wherein chips are coupled to four of their nearest neighbors (North, East, South, and West). The close proximity between chips in a two-dimensional grid facilitates high-throughput and low-latency communication between adjacent chips. Moreover, a two-dimensional grid network can be easily implemented with existing packaging technologies, which are well-suited to planar layouts. Unfortunately, existing routing mechanisms for two-dimensional grid networks can be quite complicated because they must deal with collisions, load-balancing issues and must avoid deadlock conditions.

Memory systems are a major limitation to performance in modern computer systems. Although the speed of processors has increased dramatically, the latency of memory access has not been reduced commensurately. The result is that computer processors spend relatively longer times waiting for a response from their memory systems. In a modern computing system, the processor may lose hundreds of potential machine cycles waiting for some piece of data from memory.

Hence, what is needed is a method and an apparatus that facilitates fast chip-to-chip communications within a computer system without the problems described above.

SUMMARY

One embodiment of the present invention provides a system for routing data between integrated circuit devices. This system couples together an n-dimensional grid of integrated circuit devices using multiple independent communication networks, wherein each of the communication networks moves data in only two orthogonal directions (e.g., when n=2, the directions can be North and East, North and West, South and East, or South and West). The system also includes a routing mechanism that routes data across these communication networks, as well as, into, out of, and through integrated circuits within the n-dimensional grid of integrated circuits. Note that the process of routing a signal across a given network is greatly simplified because it is not possible to create a cycle that causes a deadlock within a given network.

In a variation of this embodiment, the n-dimensional grid of integrated circuit devices includes memory devices.

In a further variation, the n-dimensional grid of integrated circuit devices includes processor devices.

In a further variation, the multiple communication networks for a two-dimensional grid include a communication network configured to move signals North and East, a communication network configured to move signals North and West, a communication network configured to move signals South and East, and a communication network configured to move signals South and West.

In a further variation, the routing mechanism is configured to statically route data items across the multiple communication networks.

In a further variation, the routing mechanism is configured to dynamically route data items through network junctions within each integrated circuit.

In a further variation, a header attached to each data item indicates a number of horizontal steps and a number of vertical steps required for the data item to reach its destination. During the dynamic routing process, at each network junction, the routing mechanism removes a horizontal step or a vertical step from the header for the data item, depending on which dimension is dynamically selected.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet, storage SA and NAS, LAN, system SAN, backplane, SOC, etc.

Circuit Devices

Figure 1:
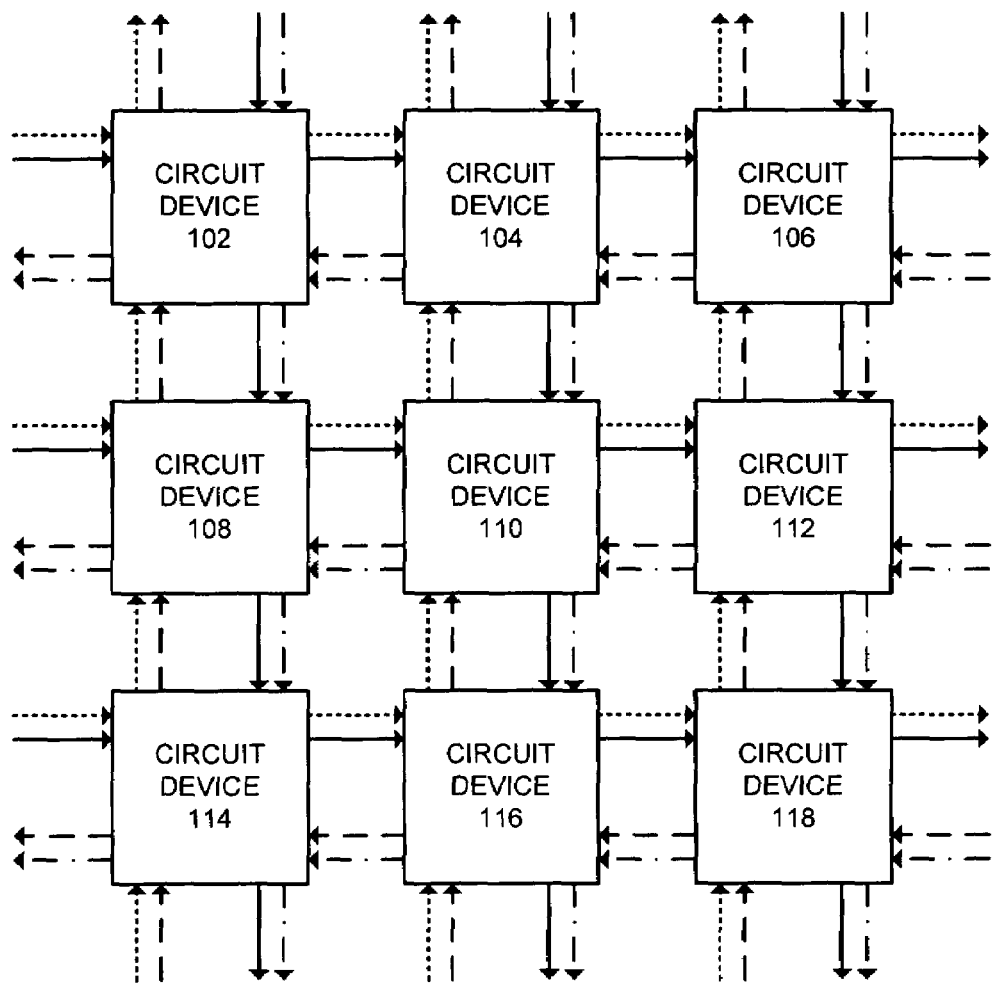
FIG. 1 illustrates circuit devices coupled together in accordance with an embodiment of the present invention.

FIG. 1 illustrates a number of circuit devices coupled together in accordance with an embodiment of the present invention. Note that circuit devices 102, 104, 106, 108, 110, 112, 114, 116, and 118 are coupled together by multiple independent networks. These multiple, independent networks are described in detail below in conjunction with FIGS. 2-4. Note that the any number of circuit devices can be included to form a grid of circuit devices as large as desired. Note also that while the following description relates to a two-dimensional grid, it will be obvious to a person with ordinary skill in the art that the system can be extended to any number of orthogonal dimensions.

In one embodiment of the invention, circuit devices 102, 104, 106, 108, 110, 112, 114, 116, and 118 are memory devices that are driven from the edge of the grid by processors (not shown). In another embodiment of, one or more of the circuit devices, such as circuit device 110, is a processor.

The communication network illustrated in FIG. 1 has a number of advantages. In a two-dimensional grid, the average distance (hamming distance) between two circuit devices grows linearly, while the number of the circuit devices grows as the square of the distance. Hence, while the communication delay increases linearly, the number of devices that can be reached increases quadratically. Moreover, the close proximity of neighboring chips allows fast chip-to-chip communication. In order to improve performance, data that is accessed most often can be placed in a memory device that is near to the processor circuit device, whereas data that is rarely accessed can be place in more distant memory devices. While the description herein relates to a two-dimensional grid, it should be noted that the system can easily be extended to an arbitrary n-dimensional grid with no changes to the basic details of the present invention.

Network Communication Directions

Figure 2:
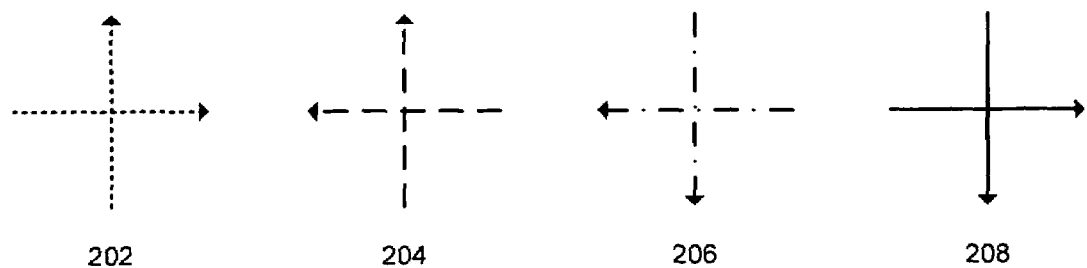
FIG. 2 illustrates communication directions for the communication networks in accordance with an embodiment of the present invention.

FIG. 2 illustrates the communication directions associated the different communication networks in accordance with an embodiment of the present invention. The system illustrated in FIG. 1 includes four networks 202, 204, 206, and 208. The communication directions for networks 202, 204, 206, and 208 are illustrated in FIG. 2.

Network 202 moves data only North or East. Network 204 moves data only North or West. Network 206 moves data only South or West. Finally, network 208 moves data only South or East. Note that since the distance from source to destination increases monotonically as the data is routed along the network, there can be no cycles in the graph and thus, no deadlocks are possible.

The available paths between peers in these networks are shortest paths relative to Hamming distance. Moreover, regarding the two-dimensional (respectively, n-dimensional) grid, all of the shortest paths are available.

Single Network

Figure 3:
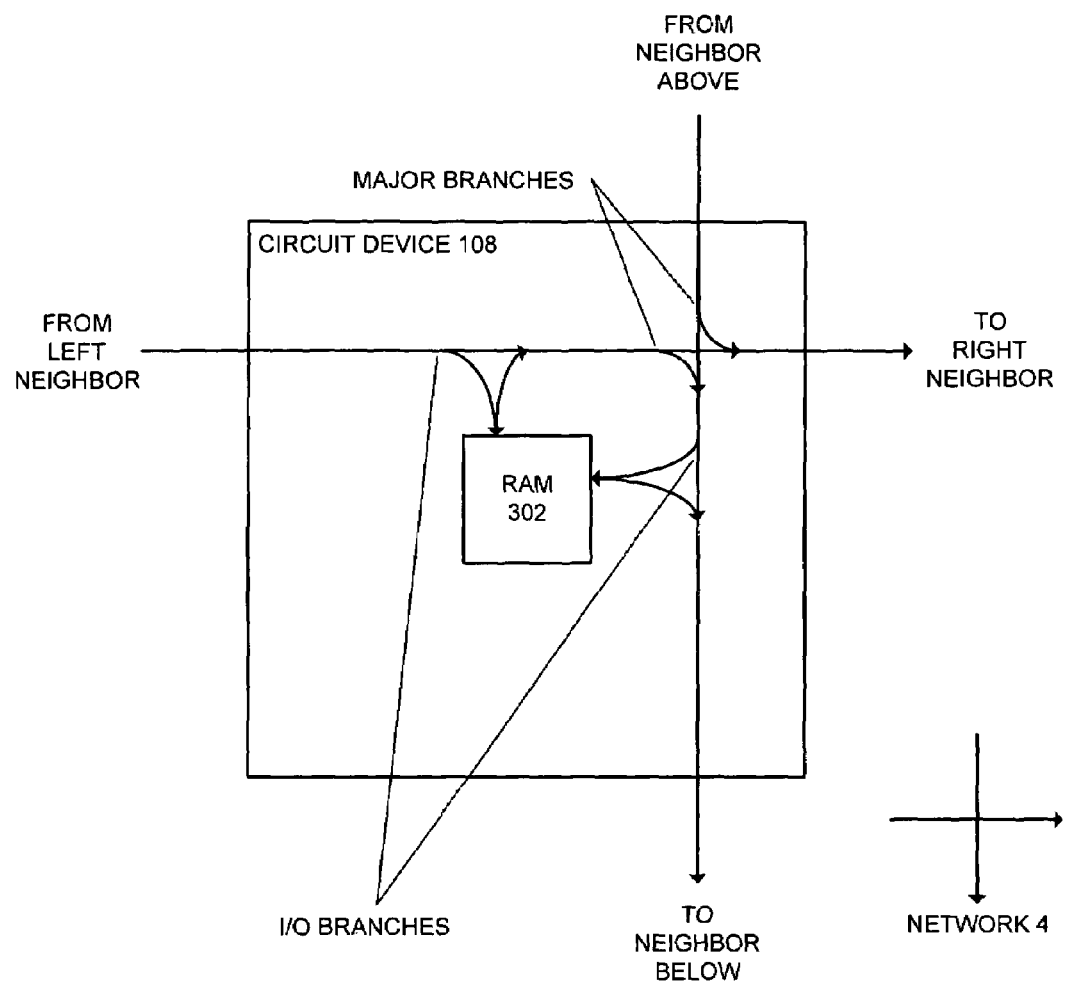
FIG. 3 illustrates a single network implementation within a circuit device in accordance with an embodiment of the present invention.

FIG. 3 illustrates a single network within a circuit device in accordance with an embodiment of the present invention. The network illustrated in FIG. 3 is network 208 from FIG. 2. Network 208 can move data only South and East. Each of networks 202, 204, 206 and 208 operates in a similar manner so only the operation of network 208 will be discussed in detail herein.

During operation of network 208, data enters circuit device 108 either from its Western neighbor or its Northern neighbor. Once data enters circuit device 108, the data can be moved into RAM 302, or can exit circuit device 108 either to the East or the South. Note that in some embodiments, RAM 302 can be a processor or other type circuit device. Two direction-switching branches are included on network 208 within circuit device 108. One of these branches switches the data from the Western neighbor to the Southern neighbor, while the other branch switches the data from the Northern neighbor to the Eastern neighbor. Note that the data can pass through circuit device 108 without switching direction. Two I/O branches are also provided to move data into and out of the circuit (RAM 302 in this case).

When data needs to be routed between two circuit devices, the source calculates the horizontal distance and the vertical distance of the destination using Cartesian coordinates for each of the two circuit devices. The source then creates some information attached to the data, for instance a header, which includes the number of horizontal steps and the number of vertical steps between these circuit devices. Note that in one embodiment of the present invention the number of steps is represented by a single bit for each step. However, in an alternate embodiment, the number of steps can be encoded differently, for instance by an integer. Note also that only the absolute value of the number of steps is encoded in the header.

The sign of the number of horizontal steps and vertical steps is used to determine which network is used to transfer the data.

The routing into the circuit device can be implicit, i.e. when no more routing information is available, we route into the device itself. For instance, when data and its associated header enter a circuit device, the number of steps remaining is examined. If both the horizontal and vertical number of steps is zero—all of the bits are set to zero in the case where each step is represented by a bit—the I/O branch routes the data into the element within the circuit device. For example, if all of the bits are set to zero in the header associated with data entering circuit device 108, the data is routed to RAM 302. Otherwise, the data is routed through the major branches based on the bits that are set and possible contention for an output path. This process is described in more detail in conjunction with FIG. 6 below.

Networks Within a Circuit Device

Figure 4:
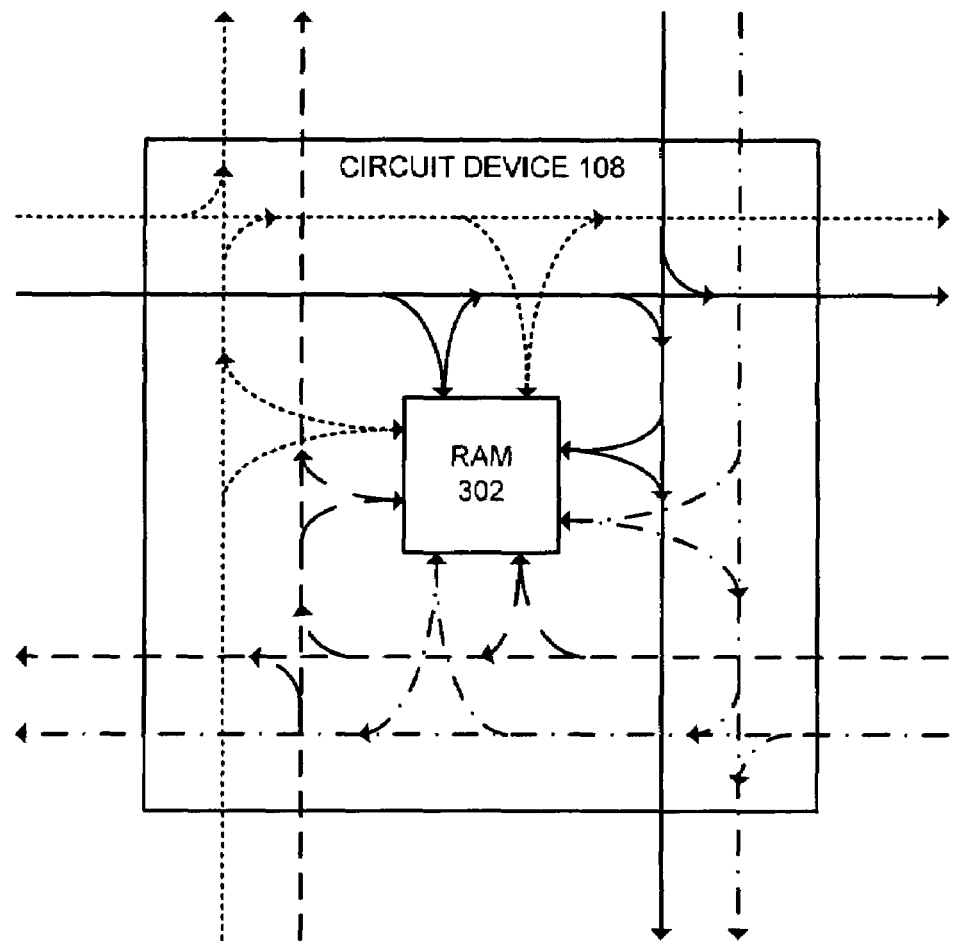
FIG. 4 illustrates the networks within a circuit device in accordance with an embodiment of the present invention.

FIG. 4 illustrates multiple networks combined within a circuit device in accordance with an embodiment of the present invention. In particular, circuit device 108 includes RAM 302 and four networks. Each of the four networks operates essentially as described above for network 208. The input and output directions for each of the four networks is as described above in conjunction with FIG. 2. Note that there is no direct connection between any of the networks. Note also that the networks operate asynchronously and independently.

Paths Between Circuit Devices

Figure 5:
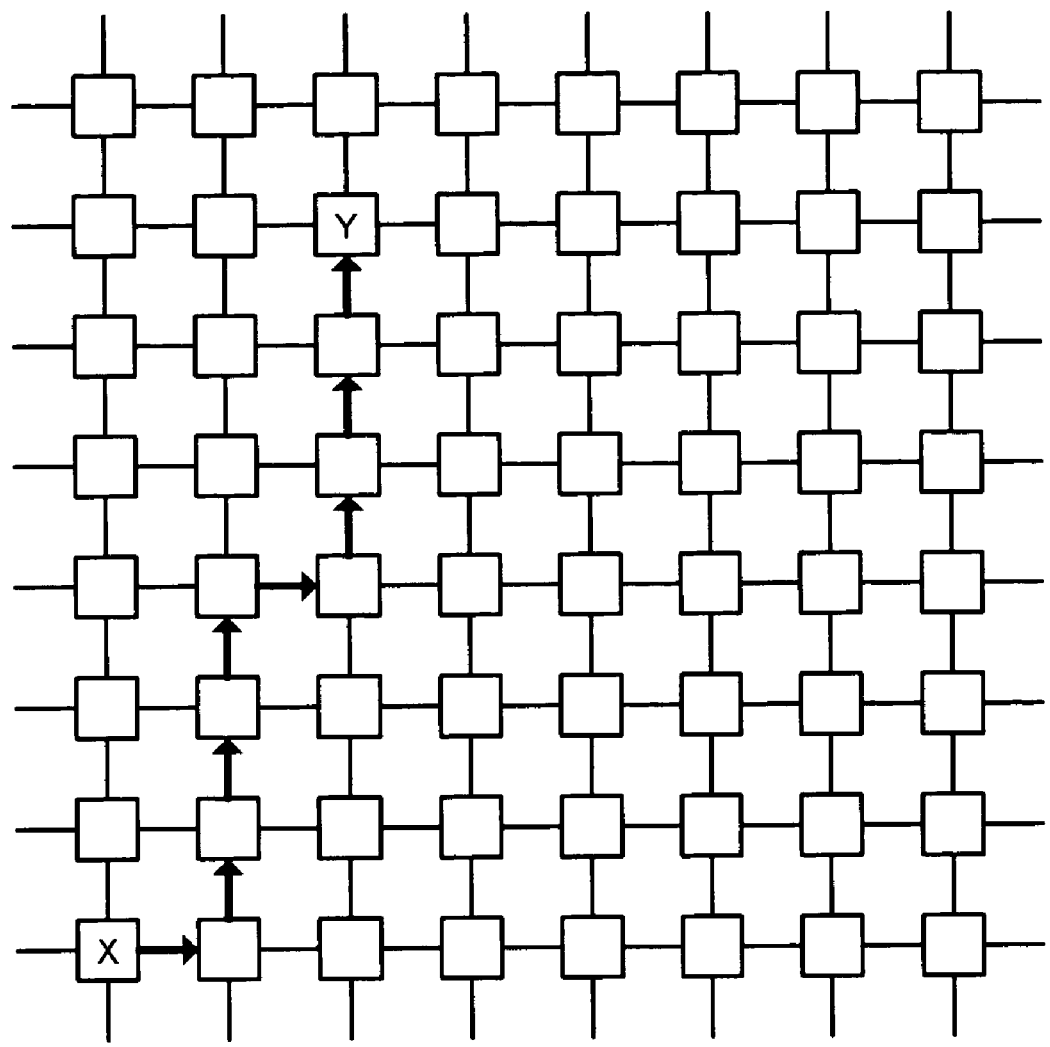
FIG. 5 illustrates a possible path between two circuit devices in accordance with an embodiment of the present invention.

FIG. 5 illustrates a possible path between two circuit devices in accordance with an embodiment of the present invention. A grid of circuit devices is coupled together by the four networks as describe above. In FIG. 5, a single line is shown between each circuit device in place of the multiple networks in order to simplify the diagram. Assume that data need to be passed from circuit device "X" to circuit device "Y." The source circuit device (X) calculates the distance between device "X" and device "Y" to be two horizontal steps and vertical steps and encodes this data in the header. Since the destination is to the right and up from the source, the source selects network 1 to send the data (and the associated header).

As illustrated in FIG. 5, the data is moved to the circuit device to the right of the source. The bit representing this horizontal transition is cleared by shifting the bit out of the header and shifting in a zero bit. Note that other methods of reducing the number of remaining steps can be used. As the data is routed between device "X" and device "Y," each circuit device forwards the data and the header in one of the two directions until the count in each direction is reduced to zero. This routing can depend on any of several strategies. For instance, the routing can be based on information from the data packet, the local switch and/or link state, or the global system state. The routing decisions that are made at each circuit device can thus range/include static source routing and dynamic reaction to contentions as in hot-potato routing. These are all shortest path.

When the count is reduced to zero in each direction, the data has reached destination "Y." Note that there are several paths that can be taken between "X" and "Y." The path chosen depends upon contention for the network paths and the routing decisions that are made at each circuit device.

Creating a Header

Figure 6:
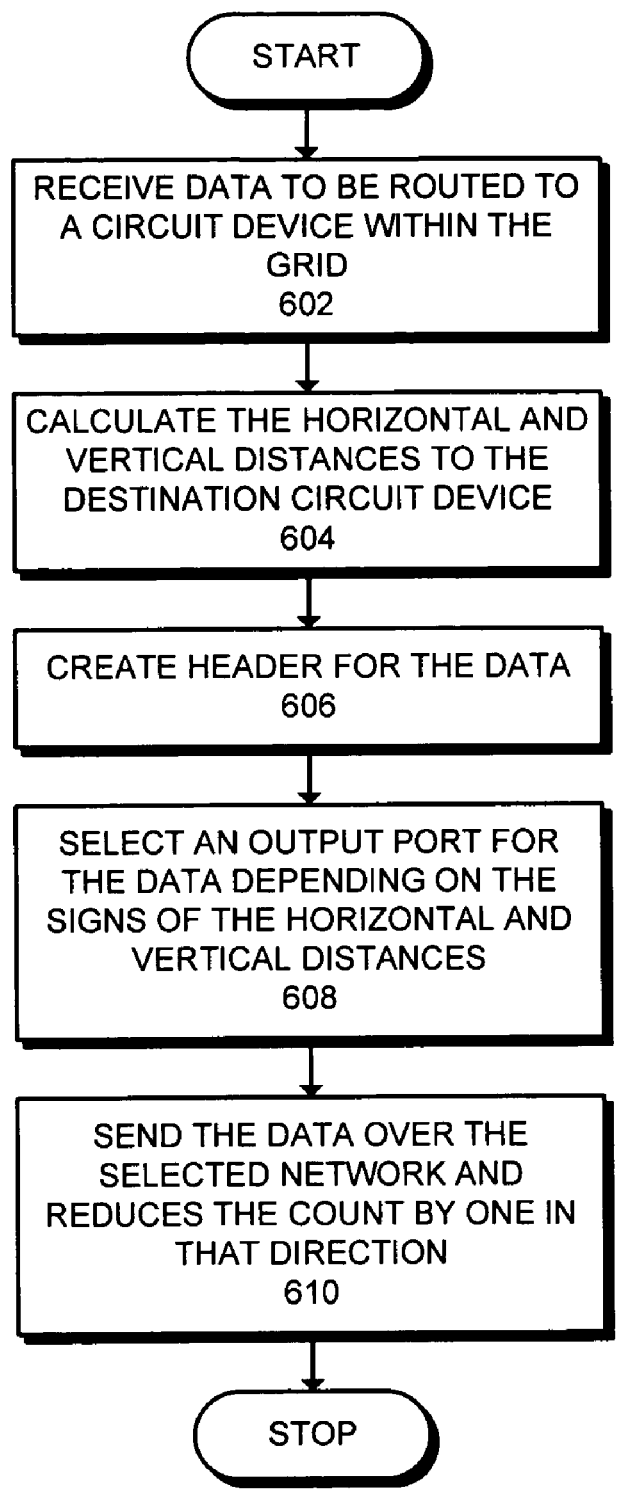
FIG. 6 presents a flowchart illustrating the process of creating a routing header and sending data in accordance with an embodiment of the present invention.

FIG. 6 presents a flowchart illustrating the process of creating a routing header and sending data in accordance with an embodiment of the present invention. The system starts when data is received which is to be routed to a circuit device within the grid (step 602). Next, the system calculates the horizontal and vertical distances to the destination circuit device (step 604). The horizontal and vertical distances can be calculated by taking the difference between the Cartesian coordinates of the destination and the source ($Y_D$-$Y_S$ and $X_D$-$X_S$). The system then creates a header for the data, which includes the number of horizontal steps and vertical steps between the source and destination (step 606).

The system then selects an output network for the data depending on the signs of the horizontal and vertical distances to the destination (step 608). Finally, the system sends the data over the selected network and reduces the count in the appropriate direction by one (step 610). Note that the process continues as describe below in conjunction with FIG. 7 until the data reaches the destination.

Routing Data Within a Circuit Device

Figure 7:
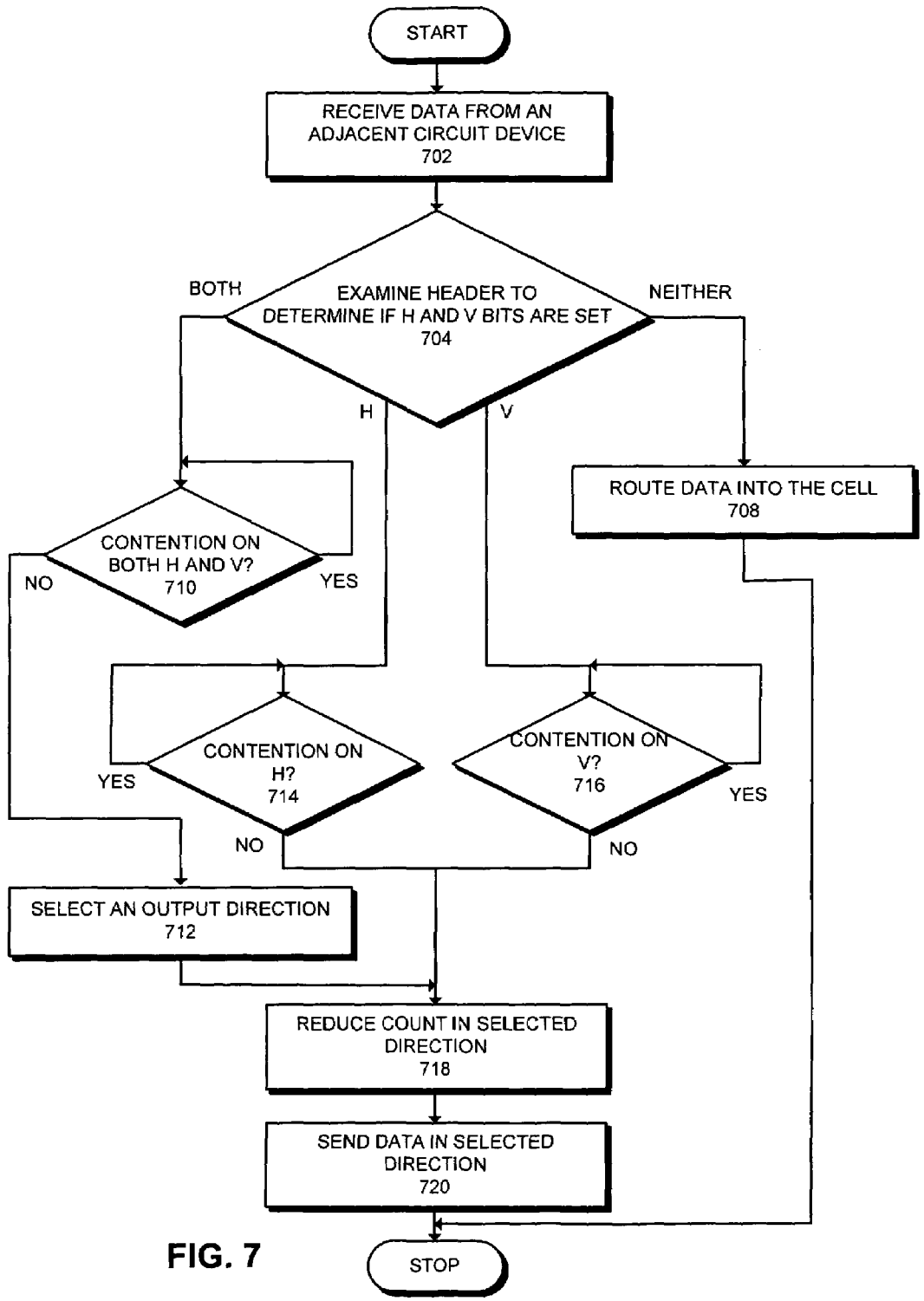
FIG. 7 presents a flowchart illustrating the process of routing data within a circuit device in accordance with an embodiment of the present invention.

FIG. 7 presents a flowchart illustrating the process of routing data within a circuit device in accordance with an embodiment of the present invention. Note that this a representative strategy. There are numerous strategies that will accomplish the objective. The system starts when a circuit device receives data from an adjacent circuit device (step 702). Next, the system examines the header to determine whether the H and V bits are set (step 704). If neither the H nor the V bits are set, the system routes the data into the cell concluding the data transfer (step 708).

If both the H and V bits are set, the system determines if there is contention on both the H and V outputs (step 710). If so, the system returns to step 710 to wait for the contention to end on either direction. Otherwise, the system selects an output direction for the data (step 712). Note that if only one direction does not have contention, that is the chosen direction. However, if neither H nor V has contention, a direction is selected using a predetermined means, such as random or round robin.

If only H bits are set at step 704, the system determines if there is contention in the H direction (step 714). If so, the system returns to step 714 to wait for the contention to end. Likewise, if only V bits are set at step 704, the system determines if there is contention in the V direction (step 716). If so, the system returns to step 716 to wait for the contention to end.

After selecting a direction at step 712 or after there is no contention at steps 714 or 716, the system reduces the count in the selected direction (step 718). Note that this decrement can be done in several places after the branch switching decision is taken. Finally, the system sends the data in the selected direction (step 720).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus for routing data between integrated circuit devices, comprising:
    an two-dimensional grid of integrated circuit devices;
    a plurality of communication networks coupling the two-dimensional grid of integrated circuit devices, wherein the plurality of communication networks includes:
        a first separate communication network configured to move data unidirectionally in a North direction and an East direction along communication lines used by only the first communication network;
        a second separate communication network configured to move data unidirectionally in the North direction and a West direction along communication lines used by only the second communication network;
        a third separate communication network configured to move data unidirectionally in a South direction and the East direction along communication lines used by only the third communication network; and
        a fourth separate communication network configured to move data unidirectionally in the South direction and the West direction along communication lines used by only the fourth communication network; and
    a routing mechanism configured to route data across the plurality of communication networks as well as into, out of, and through a given integrated circuit within the two-dimensional grid of integrated circuits;
    whereby a process of routing data across a given communication network only creates a deadlock free cycle within the given communication network; and
    whereby the process of routing data yields a shortest path between source and destination.

2. The apparatus of claim 1, wherein the n-dimensional grid of integrated circuit devices includes memory devices.

3. The apparatus of claim 1, wherein the n-dimensional grid of integrated circuit devices includes processor devices, I/O devices, digital signal processors, field programmable gate arrays, sensors, and controllers.

4. The apparatus of claim 1, wherein the routing mechanism is configured to statically route data items across the plurality of communication networks.

5. The apparatus of claim 1, wherein the routing mechanism is configured to dynamically route data items through network junctions within each integrated circuit.

6. The apparatus of claim 1,
wherein a header attached to each data item in a two-dimensional grid indicates a number of horizontal steps and a number of vertical steps required for the data item to reach its destination; and
wherein during a dynamic routing process, the routing mechanism removes a horizontal step or a vertical step from the header for the data item, depending upon which direction is dynamically selected.

7. A method for creating a computing system, comprising:
creating a two-dimensional grid of integrated circuit devices;
establishing a plurality of communication networks coupling the two-dimensional grid of integrated circuit devices, wherein establishing the plurality of communication networks involves;
establishing a first separate communication network configured to move data unidirectionally in a North direction and an East direction along communication lines used by only the first communication network;
establishing a second separate communication network configured to move data unidirectionally in the North direction and a West direction along communication lines used by only the second communication network;
establishing a third separate communication network configured to move data unidirectionally in a South direction and the East direction along communication lines used by only the third communication network; and
establishing a fourth separate communication network configured to move data unidirectionally in the South direction and the West direction along communication lines used by only the fourth communication network; and
providing a routing mechanism configured to route data across the plurality of communication networks as well as into, out of, and through a given integrated circuit within the two-dimensional grid of integrated circuits;
whereby a process of routing data across a given communication network only creates a deadlock free cycle within the given communication network; and
whereby the process of routing data yields a shortest path between source and destination.

8. The method of claim 7, wherein the n-dimensional grid of integrated circuit devices includes memory devices.

9. The method of claim 7, wherein the n-dimensional grid of integrated circuit devices includes processor devices, I/O devices, digital signal processors, field programmable gate arrays, sensors, and controllers.

10. The method of claim 7, wherein the routing mechanism is configured to statically route data items across the plurality of communication networks.

11. The method of claim 7, wherein the routing mechanism is configured to dynamically route data items through network junctions within each integrated circuit.

12. The method of claim 7,
wherein a header attached to each data item in a two-dimensional grid indicates a number of horizontal steps and a number of vertical steps required for the data item to reach its destination; and
wherein during a dynamic routing process, the routing mechanism removes a horizontal step or a vertical step from the header for the data item, depending upon which direction is dynamically selected.

13. A means for routing data between integrated circuit devices within a two-dimensional grid of integrated circuit devices, comprising:
a communication means comprising a plurality of communication networks coupling the two-dimensional grid of integrated circuit devices, wherein
a first separate communication network moves data unidirectionally in a North direction and an East direction along communication lines used by only the first communication network;
a second separate communication network moves data unidirectionally in the North direction and a West direction along communication lines used by only the second communication network;
a third separate communication network moves data unidirectionally in a South direction and the East direction along communication lines used by only the third communication network; and
a fourth separate communication network moves data unidirectionally in the South direction and the West direction along communication lines used by only the fourth communication network; and
a routing means for routing data across the plurality of communication networks as well as into, out of, and through a given integrated circuit within the two-dimensional grid of integrated circuits;
whereby the means of routing data yields a shortest path between source and destination.

14. The means of claim 13, wherein the n-dimensional grid of integrated circuit devices includes memory devices.

15. The means of claim 13, wherein the n-dimensional grid of integrated circuit devices includes processor devices, I/O devices, digital signal processors, field programmable gate arrays, sensors, and controllers.

16. The means of claim 13, wherein data is configured to statically routed across the plurality of communication networks.

17. The means of claim 13, wherein data is dynamically routed through network junctions within each integrated circuit.

18. The means of claim 13,
wherein a header attached to each data item in a two-dimensional grid indicates a number of horizontal steps and a number of vertical steps required for the data item to reach its destination; and
wherein during a dynamic routing process, a horizontal step or a vertical step is removed from the header for the data item, depending upon which direction is dynamically selected.

* * * * *